(12) United States Patent
Saroor et al.

(10) Patent No.: US 11,310,936 B2
(45) Date of Patent: Apr. 19, 2022

(54) THERMAL MODULES FOR ELECTRONIC DEVICES

(71) Applicant: Hewlett-Packard Development Company, L.P., Spring, TX (US)

(72) Inventors: Shaheen Saroor, Spring, TX (US);
Lan-Chin Chiou, Taipei (TW);
Hung-Ming Lin, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 17/048,116

(22) PCT Filed: May 31, 2018

(86) PCT No.: PCT/US2018/035299
§ 371 (c)(1),
(2) Date: Oct. 16, 2020

(87) PCT Pub. No.: WO2019/231446
PCT Pub. Date: Dec. 5, 2019

(65) Prior Publication Data
US 2021/0153382 A1 May 20, 2021

(51) Int. Cl.
*H05K 7/20* (2006.01)
*G06F 1/20* (2006.01)
*H05K 5/02* (2006.01)

(52) U.S. Cl.
CPC ......... *H05K 7/20154* (2013.01); *G06F 1/206* (2013.01); *H05K 5/0213* (2013.01)

(58) Field of Classification Search
CPC ...... G06F 1/20; G06F 2200/201; G06F 1/206;
H05K 7/20145; H05K 1/0203; H05K 2201/066; H05K 7/20163; H05K 7/20727; H05K 7/20154; H05K 2201/064; H05K 7/20172; H05K 7/20409; H05K 7/20809; H05K 7/20136; H05K 7/2039;
(Continued)

(56) References Cited

U.S. PATENT DOCUMENTS

| 6,626,233 B1 * | 9/2003 | Connors | ............. F28D 15/0233 |
| | | | 165/104.33 |
| 6,654,247 B1 * | 11/2003 | Lee | ........................... G06F 1/20 |
| | | | 165/121 |

(Continued)

FOREIGN PATENT DOCUMENTS

| CN | 2606455 | 3/2004 |
| CN | 1862448 | 11/2006 |

(Continued)

*Primary Examiner* — Michael A Matey
(74) *Attorney, Agent, or Firm* — Hanley Flight & Zimmerman LL

(57) ABSTRACT

Example thermal modules are disclosed. An example thermal module for use with an electronic device includes a first heatsink defining a first airflow exit. The first heatsink including a first set of fins having a first height and a second set of fins having a second height. The second height being less than the first height. The second set of fins being adjacent the first airflow exit. A second heatsink defines a second airflow exit. The second heatsink is spaced from the first heatsink to form a gap therebetween. The second heatsink is thermally coupled to the first heatsink via a heat pipe.

16 Claims, 11 Drawing Sheets

(58) Field of Classification Search
CPC .............. H05K 7/20972; H05K 5/0213; F28F 2215/00; F28F 3/02; F28F 3/048
See application file for complete search history.

(56) References Cited

U.S. PATENT DOCUMENTS

| | | | |
|---|---|---|---|
| 6,778,392 B2* | 8/2004 | Chiou | G06F 1/203 165/121 |
| 7,495,913 B1 | 2/2009 | Liu et al. | |
| 8,699,226 B2* | 4/2014 | Tanner | F28F 19/00 361/710 |
| 9,795,055 B1* | 10/2017 | Campbell | H05K 7/20145 |
| 10,345,874 B1* | 7/2019 | Narasimhan | H01L 23/3672 |
| 2003/0030980 A1 | 2/2003 | Bird et al. | |
| 2003/0066626 A1 | 4/2003 | Bird et al. | |
| 2003/0189815 A1 | 10/2003 | Lee | |
| 2004/0118550 A1 | 6/2004 | Turocy et al. | |
| 2005/0041392 A1* | 2/2005 | Chen | H05K 7/20727 361/695 |
| 2006/0067051 A1 | 3/2006 | Ku | |
| 2006/0164808 A1* | 7/2006 | Stefanoski | G06F 1/20 361/700 |
| 2008/0074845 A1* | 3/2008 | Sun | H01L 23/467 361/712 |
| 2008/0105410 A1* | 5/2008 | Hwang | G06F 1/20 165/104.33 |
| 2008/0151505 A1* | 6/2008 | Chen | H01L 23/467 361/719 |
| 2010/0071875 A1* | 3/2010 | Hwang | G06F 1/203 165/80.3 |
| 2010/0142142 A1* | 6/2010 | Riebel | H05K 7/20136 361/679.47 |
| 2011/0226451 A1* | 9/2011 | Ikeda | G06F 1/20 165/121 |
| 2011/0286178 A1* | 11/2011 | Bridges | F28F 3/048 361/679.54 |
| 2011/0292608 A1* | 12/2011 | Tan | H01L 23/467 361/696 |
| 2012/0140399 A1* | 6/2012 | Huang | G06F 1/181 361/679.31 |
| 2012/0170207 A1* | 7/2012 | Li | G06F 1/20 361/679.47 |
| 2012/0262879 A1* | 10/2012 | Inoue | H05K 7/20145 361/697 |
| 2013/0050941 A1* | 2/2013 | Wang | G06F 1/203 361/692 |
| 2013/0083253 A1* | 4/2013 | Maeshima | H04N 5/64 348/739 |
| 2013/0194744 A1* | 8/2013 | Chen | H01L 23/467 361/679.47 |
| 2013/0286590 A1* | 10/2013 | Iwata | H05K 7/20 361/697 |
| 2014/0116659 A1* | 5/2014 | Lin | H01L 23/3672 165/121 |
| 2015/0043148 A1* | 2/2015 | Zhang | H05K 7/20727 361/679.32 |
| 2016/0037683 A1* | 2/2016 | Tamaoka | H01L 23/427 165/104.21 |
| 2017/0164520 A1 | 6/2017 | Barron et al. | |
| 2017/0347488 A1* | 11/2017 | Wu | H01L 23/427 |
| 2019/0053401 A1* | 2/2019 | Chang | G06F 1/20 |
| 2019/0239393 A1* | 8/2019 | Liang | H05K 7/20727 |

FOREIGN PATENT DOCUMENTS

| | | |
|---|---|---|
| CN | 103458653 | 12/2013 |
| WO | WO2017180148 A1 | 10/2017 |

* cited by examiner

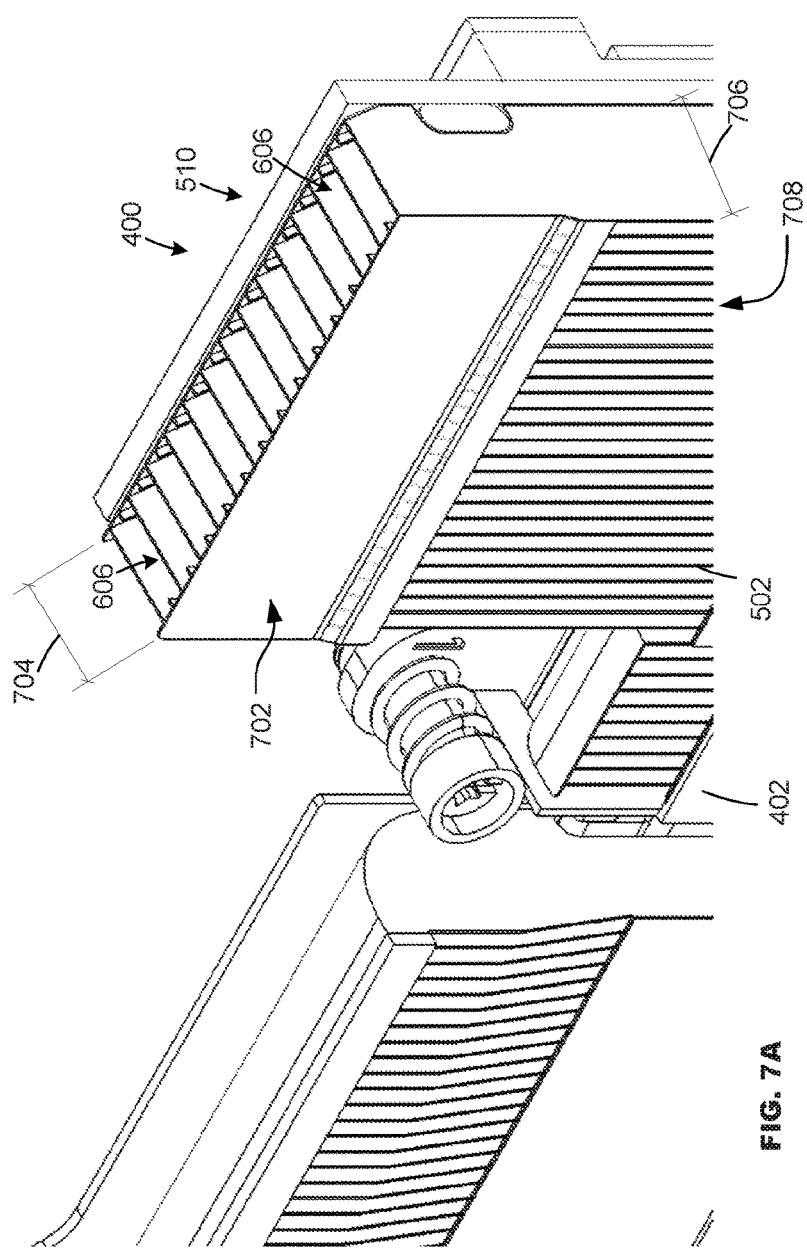
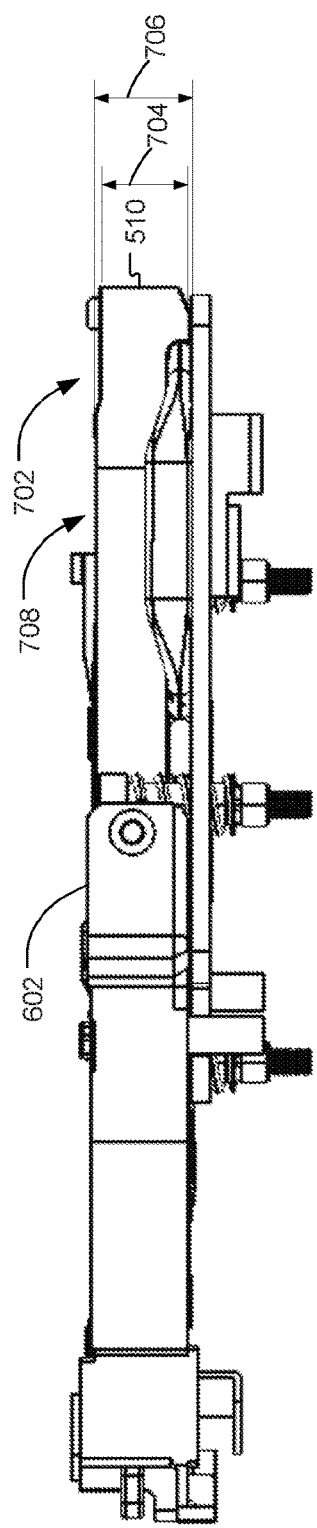
FIG. 7A
FIG. 7B

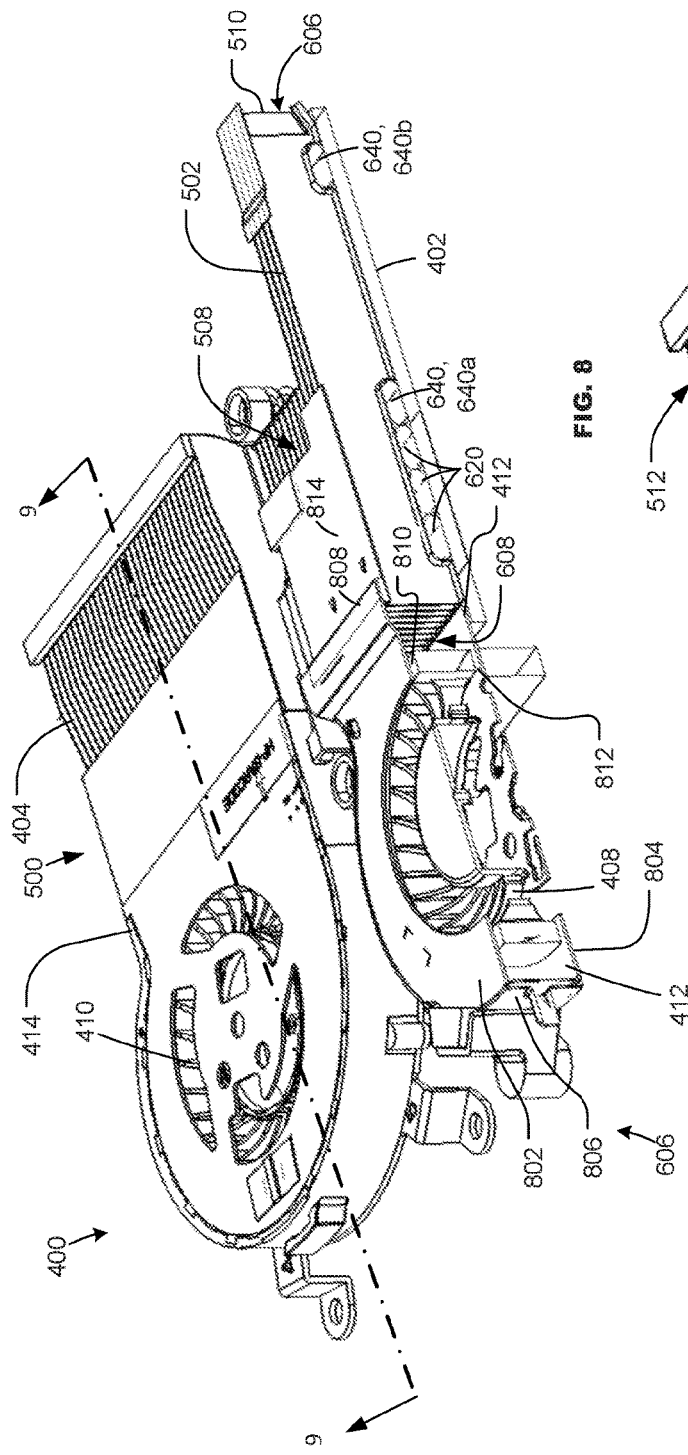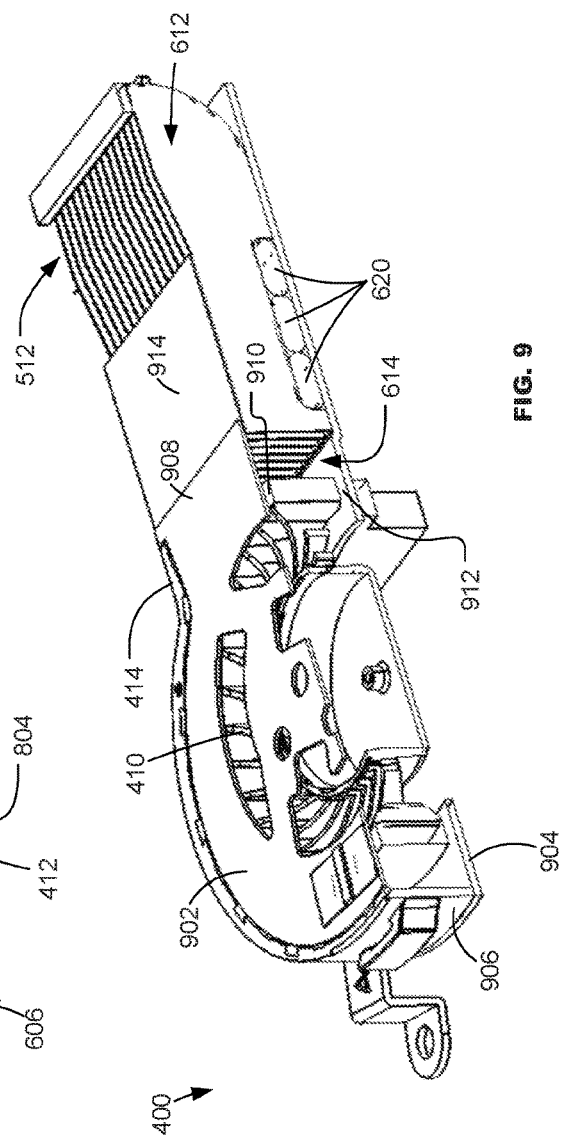

THERMAL MODULES FOR ELECTRONIC DEVICES

BACKGROUND

Electronic devices employ electronic components such as, for example, circuit boards, mother boards, etc., that generate a significant amount of heat during operation. Removing heat from the electronic components is critical for system performance. Devices use various cooling systems to remove heat.

BRIEF DESCRIPTION OF THE DRAWINGS

FIG. 7A is a partial, enlarged view of the example thermal module of FIG. 4.

FIG. 7B is a side view of the example thermal module of FIG. 4.

FIG. 8 is a cross-sectional view of the example thermal module of FIG. 4 taken along line 8-8 of FIG. 4.

FIG. 9 is a cross-sectional view of the example thermal module of FIG. 4 taken along line 9-9 of FIG. 8.

Figure 1:
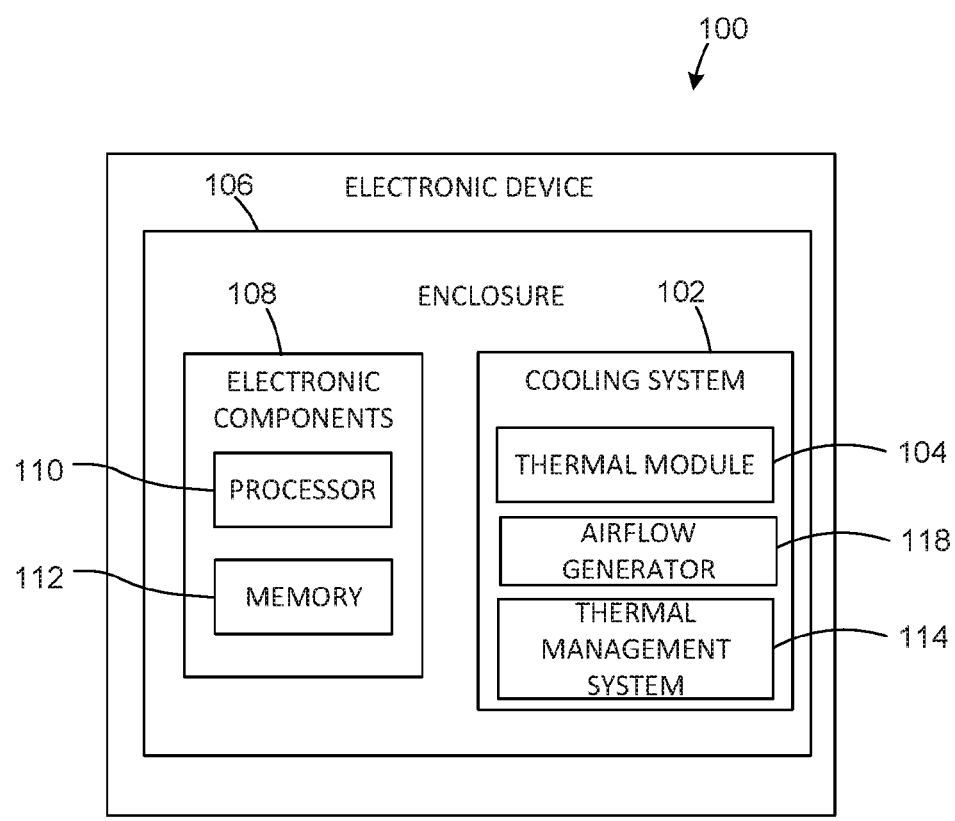
FIG. 1 is a block diagram an example electronic device implemented with an example thermal module in accordance with the teachings disclosed herein.

Where ever possible the same reference numbers will be used throughout the drawing(s) and accompanying written description to refer to the same or like parts. The figures are not necessarily to scale and certain features and certain views of the figures can be shown exaggerated in scale or in schematic for clarity and/or conciseness. Additionally, several examples have been described throughout this specification. Any features from any example can be included with, a replacement for, or otherwise combined with other features from other examples.

DETAILED DESCRIPTION

Certain examples are shown in the identified figures and disclosed in detail herein. Although the following discloses example methods and apparatus, it should be noted that such methods and apparatus are merely illustrative and should not be considered as limiting the scope of this disclosure.

As used herein, directional terms, such as "upper," "lower," "top," "bottom," "front," "back," "leading," "trailing," "left," "right," etc. are used with reference to the orientation of the figures being described. Because components of various examples disclosed herein can be positioned in a number of different orientations, the directional terminology is used for illustrative purposes and is not intended to be limiting.

Electronic devices such as, for example, computers (e.g., desktop computers) have certain thermal management and acoustic thresholds to meet when operating under predefined operating conditions. For example, increased computing power of electronic components significantly increases an amount of heat generated by the electronic components that is to be dissipated by a thermal management system to enable the electronic components to operate within a manufacturer recommended temperature threshold range. Thus, removing or dissipating heat from the electronic components affects overall system performance (e.g., efficiency).

As the physical size of electronic devices decreases, thermal system design needed to satisfy thermal specifications increases in complexity. For example, meeting industry standard thermal management and/or acoustic thresholds become increasingly difficult to maintain or achieve as computing power of electronic components advances (e.g., possessors operate at faster speeds) with a decreasing form factor of the electronic devices. To dissipate heat, electronic devices employ heatsinks and fans to generate airflow across the heatsinks. However, some fans can generate significant noise during operation. Depending on form factor of the electronic device, fans positioned in a chassis of the electronic device may need to operate at significant speeds (e.g., revolutions per minute) to generate sufficient airflow to cool and/or dissipate heat from the electronic devices to meet industry standards and/or thresholds. Additionally, airflow generated across heatsinks positioned in the chassis of the electronic device can generate unwanted noise. In some instances, such noise generation from the fans and/or the airflow can produce noise levels (e.g., decibels) greater than a threshold or industry standard and, therefore, may be unacceptable. Thus, larger sized form factors may be needed to space apart heat generating components and/or to include additional heatsinks and/or fans. Therefore, industry standard acoustic thresholds or limits can impact a thermal management system (e.g., number of fans, fan speed, number of heatsinks, etc.). As a result, employing electronic components with greater computing power may limit reduction of a form factor of an electronic device.

Example cooling systems disclosed herein employ a thermal module to provide thermal management for high performance electronic components that are employed by electronic devices having a relatively small form factor. For example, example thermal modules disclosed herein can be used in a Desktop Mini (DM) computer that is under 1 Liter in volume and supports a full performance 95 Watt (W) Thermal Design Power (TDP) commercial grade processor. Additionally, the example cooling systems disclosed herein meet industry thermal management and acoustic thresholds or standards, while enabling employment of a small form factor electronic device. Specifically, example cooling systems disclosed herein maintain temperatures within industry thresholds and meet system acoustic standards. For example, cooling systems disclosed herein prevent temperature from exceeding certain temperature thresholds for a hard disk drive (HDD), an enclosure or chassis (e.g., a skin), and a processor, while meeting system acoustic limitations.

An example thermal module disclosed herein includes dual heatsinks thermally coupled by a plurality of heat pipes and dual fans for cooling respective ones of the heatsinks. In some examples, the thermal module provides at least three airflow outlets. In some examples, the thermal module includes at least one heatsink having reduced height heat fins to increase (e.g., maximize) airflow while satisfying acoustic limitations. To manage or dissipate heat, a first heatsink of the example thermal module can be positioned directly above the processor (e.g., a motherboard) and a second heatsink can be positioned adjacent the first heat sink. A heat pipe thermally couple the first and second heatsinks to transfer heat between the first heatsink and the second heatsink to help dissipate heat in the chassis generated by the processor. In some examples, each of the heatsinks includes a dedicated fan or blower to provide airflow through the heatsinks. More specifically, a first duct channels a first airflow from the first fan to the first heatsink and a second duct channels the second airflow from the second fan to the second heatsink. Thus, the first fan can generate a first airflow across the first heatsink and the second fan can generate a second airflow across the second heatsink. The first airflow flows through a first outlet and a second outlet, and the second airflow flows through a third outlet. In some examples, at least one of the first heatsink or the second heatsink includes a first set of fins having a reduced height adjacent a second set of fins to increase airflow characteristics and/or reduce acoustic noise conditions when airflow passes across and/or through the respective one of the first heatsink or the second heatsink. In some examples, example cooling systems disclosed herein can employ one fan and/or one heatsink (e.g., a single heatsink with a dual fan system, or a single fan with a dual heatsinks). In some examples, example cooling systems or thermal module disclosed herein can employ more than two fans and/or more than two heatsinks.

Turning more specifically to the illustrated examples, FIG. 1 depicts an example electronic device 100 that includes a cooling system 102 having a thermal module 104 in accordance with teachings disclosed herein. The electronic device 100 of the illustrated example can be a desktop computer, a laptop computer, a mobile device, a tablet, and/or any other electronic device(s). The electronic device 100 of the illustrated example defines an enclosure 106 to house or encase electronic components 108 of the electronic device 100 such as, for example, a processor 110, memory 112, etc. By way of example, the processor 110 of the illustrated example is a full performance 95 W TPD processor (e.g., a Core i7 Coffee Lake socketed processor manufactured by Intel®). By way of example, the memory 112 of the illustrated example can be a random access memory (RAM) (e.g., double data rate (DDR) memory, up to 32 Gigabyte DDR4 memory).

The cooling system 102 disclosed herein provides thermal management for the electronic components 108 of the electronic device 100 (e.g., the processor 110, etc.). The cooling system 102 of the illustrated example employs a thermal management system 114 to control or prevent temperatures of the electronic components 108 and/or the enclosure 106 from exceeding threshold operating temperatures. For example, the thermal management system controls or operates an airflow generator 118 that generates airflow across the thermal module 104 to dissipate or remove heat generated by the electronic components 108 from the enclosure 106. The airflow generator 118 can be a variable speed fan or blower.

While an example manner of implementing the electronic device 100 is illustrated in FIG. 1, one or more of the elements, processes and/or devices illustrated in FIG. 1 may be combined, divided, re-arranged, omitted, eliminated and/or implemented in any other way. Further, the example electronic components 108, the example processor 110, the example memory 112, and the example thermal management system 114 and/or, more generally, the example cooling system 102 of FIG. 1 may be implemented by hardware, software, firmware and/or any combination of hardware, software and/or firmware. Thus, for example, any of the example electronic components 108, the example processor 110, the example memory 112, and the example thermal management system 114 and/or, more generally, the example cooling system 102 of FIG. 1 could be implemented by analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example electronic components 108, the example processor 110, the example memory 112, and the example thermal management system 114 and/or, more generally, the example cooling system 102 of FIG. 1 is/are hereby expressly defined to include a non-transitory computer readable storage device or storage disk such as a memory, a digital versatile disk (DVD), a compact disk (CD), a Blu-ray disk, solid state drive (SSD), a Hard Disk Drive (HDD), etc. including the software and/or firmware. Further still, the example electronic components 108 and/or the example cooling system 102 of FIG. 1 may include elements, processes and/or devices in addition to, or instead of, those illustrated in FIG. 1, and/or may include more than one of any or all of the illustrated elements, processes and devices. As used herein, the phrase "in communication," including variations thereof, encompasses direct communication and/or indirect communication through intermediary component(s), and does not require direct physical (e.g., wired) communication and/or constant communication, but rather additionally includes selective communication at periodic intervals, scheduled intervals, aperiodic intervals, and/or one-time events.

Figure 2A:
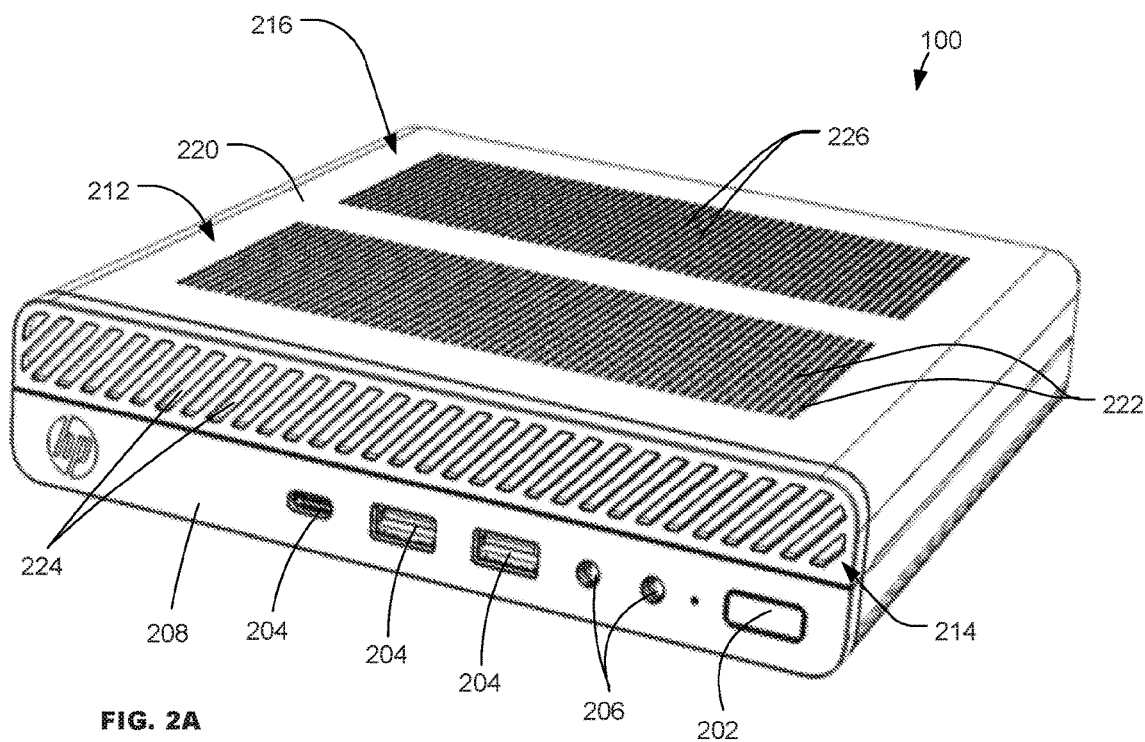
FIG. 2A is a front perspective view of an example electronic device that can implement the electronic device of FIG. 1.
Figure 2B:
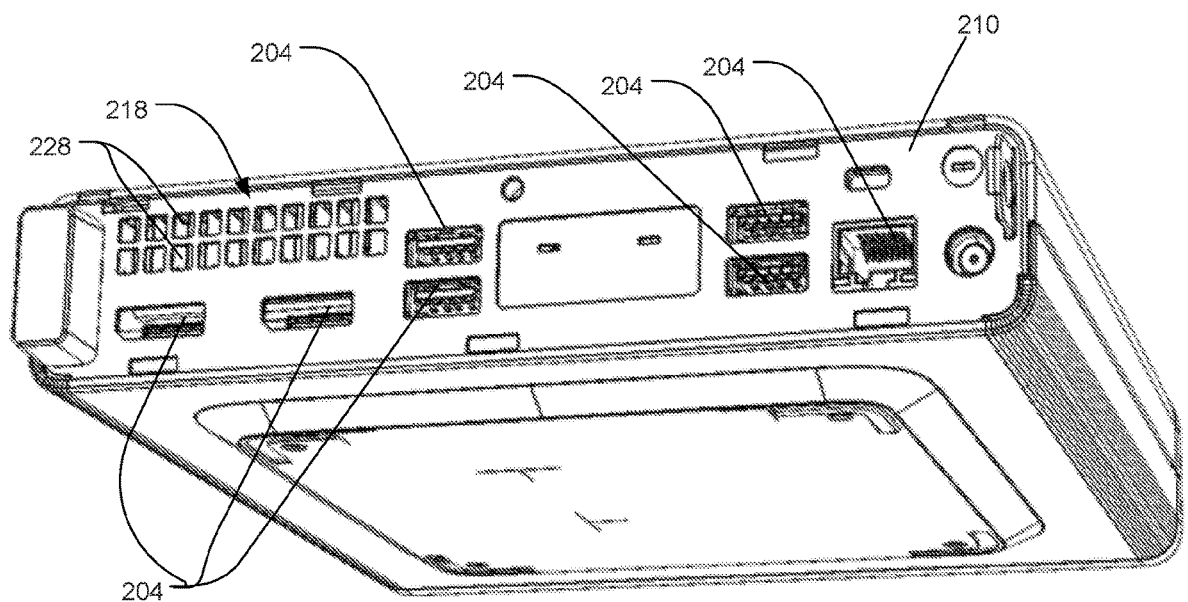
FIG. 2B is a rear, perspective view of the example electronic device of FIG. 2A.

FIGS. 2A and 2B depict an example electronic device 200 that may implement the electronic device 100 of FIG. 1. FIG. 2A is a front, perspective view of the electronic device 200. FIG. 2B is a rear, perspective view of the electronic device 200. The electronic device 200 of FIGS. 2A and 2B is a desktop computer. Additionally, as disclosed herein, the electronic device 200 of the illustrated example employs the cooling system 102 of FIG. 1 to dissipate heat from the electronic components 108 of the electronic device 200.

The electronic device 200 of the illustrated example includes a power button 202, a plurality of input/output interfaces 204 (e.g., connectors or ports), and auxiliary interfaces 206 (e.g. a headphone jack, a microphone jack, etc.). The input/output interfaces 204 of the illustrated example are accessible via a front panel 208 and a rear panel 210 of the electronic device 200. The input/output interfaces 204 include, but are not limited to, a RJ-45 interface, a universal serial bus (USB) interface (e.g., a USB 3.1 Gen 1 type C port, a USB 3.1 Gen 2 type A port, a USB 3.1 Gen 1 type A port), a display interface, a high-definition multimedia interface (HDMI), a video graphic array (VGA) interface, a local area network interface (e.g., a LAN connector), a wireless local network interface (e.g., an M.2 WLAN/BT module), and/or any other input/output interface(s) and/or connector(s) to establish communication with the electronic device 200 of FIGS. 2A and 2B.

The cooling system 102 of the illustrated example includes a first air inlet 212, a second air inlet 214, a first air outlet 216, and a second air outlet 218. Specifically, the cooling system 102 of the electronic device 200 generates airflow between the first and second air inlets 212, 214 and the first and second air outlets 216, 218 to cool the electronic components 108 of the electronic device 200. The first air inlet 212 (e.g., a primary air inlet) is located on an upper surface 220 of the electronic device 200 and the second air inlet 214 (e.g., a secondary air inlet) is located on the front panel 208. The first air inlet 212 is formed via a plurality of openings 222 (e.g., a vent) formed through the upper surface 220 and the second air inlet 214 is formed via a plurality of openings 224 formed through the front panel 208. The first air outlet 216 (e.g., a primary air outlet) is located on the upper surface 220 of the electronic device 200 adjacent or spaced relative to the first air inlet 212. The second air outlet 218 (e.g., a secondary air outlet) is located on the rear panel 210. The first air outlet 216 is provided via a plurality of openings 226 (e.g., a vent) formed through the upper surface 220 and the second air outlet 218 is provided via a plurality of openings 228 formed through the rear panel 210.

Figure 3A:
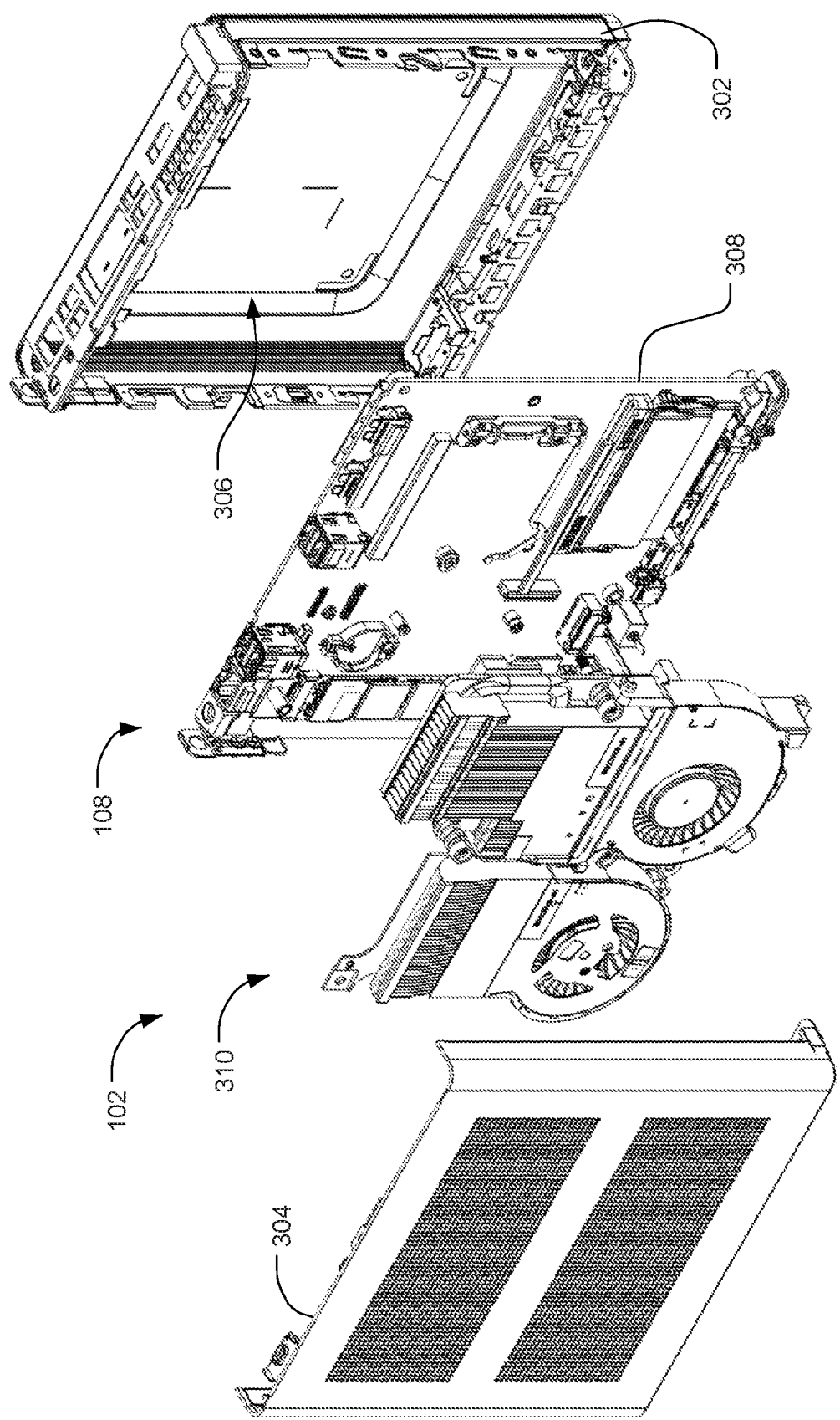
FIG. 3A is an exploded view of the example electronic device of FIGS. 2A and 2B rotated to the side.
Figure 3B:
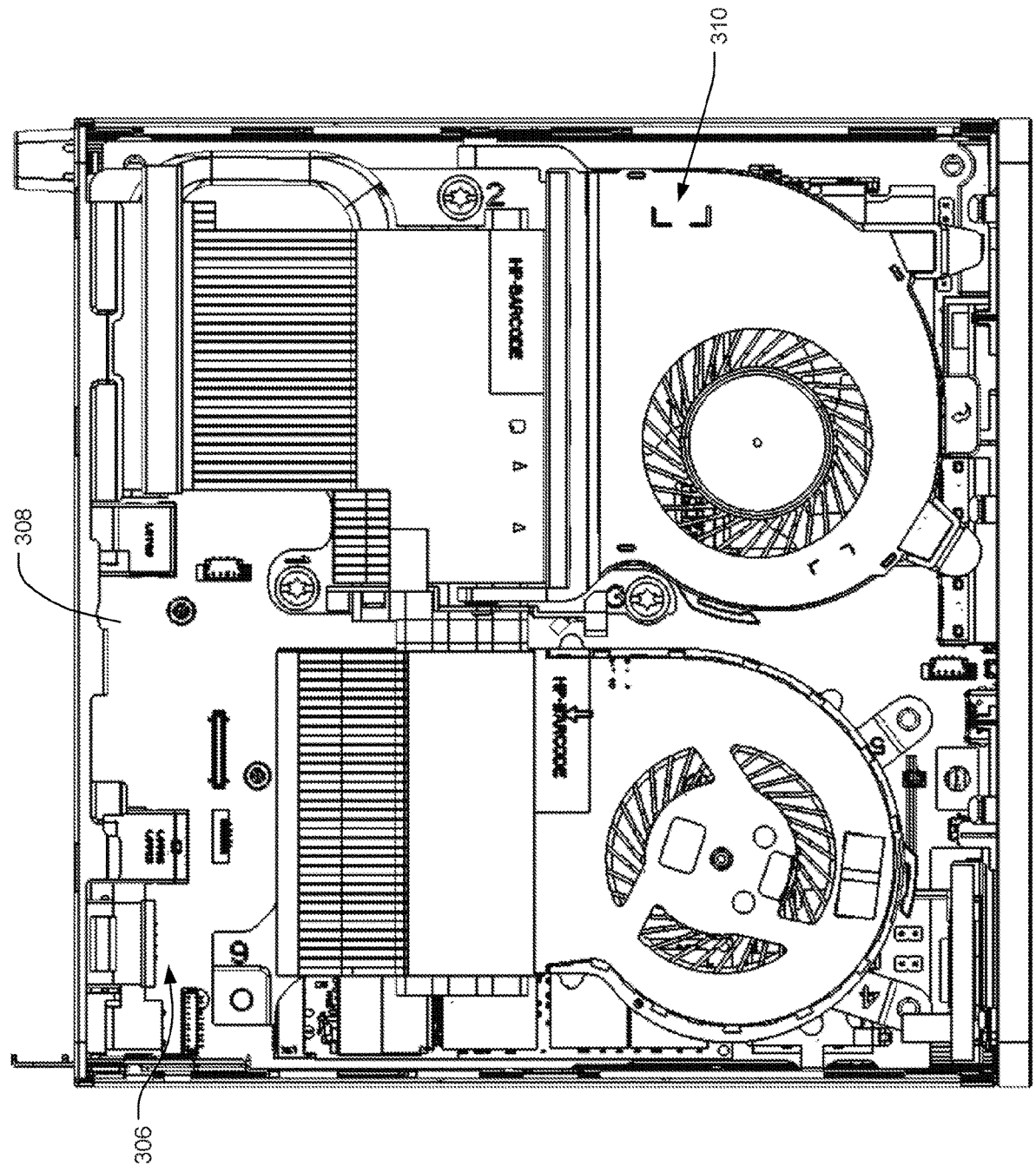
FIG. 3B is a top view of the example electronic device of FIGS. 2A-2B and 3A shown without an example cover of the example electronic device.

FIG. 3A is an exploded view of the example electronic device 200 of FIGS. 2A and 2B rotated to the side (where the top of the electronic device 200 is at the left side of the figure). FIG. 3B is a top view of the example electronic device 200 of FIGS. 2A and 2B shown without a cover. Referring to FIGS. 3A and 3B, the electronic device 200 of the illustrated example includes a chassis 300 (e.g., that can implement the enclosure 106 of FIG. 1). The chassis 300 of the illustrated example includes a base 302 and a cover 304 removably coupled to the base 302. The chassis 300 of the illustrated example defines a cavity 306 to receive the electronic components 108 of the electronic device 200.

The electronic components 108 of the illustrated example includes a circuit board 308 (e.g., a CPU, a mother board, etc.) to support or implement the processor 110, the memory 112, the power button 202, the input/output interfaces 204, the auxiliary interfaces 206, the thermal management system 114 for controlling the cooling system 102, a solid state drive (SSD) (e.g., a dual x4 PCIe lane M.2 SSD slot), and/or any other electronic or electrical component 108 of the electronic device 200. As noted above, the electronic components 108 can generate significant amount of heat during operation. To dissipate the heat from the cavity 306 of the chassis 300, the cooling system 102 of the illustrated example includes a thermal module 310. The thermal module 310 of the illustrated example can implement the thermal module 104 of FIG. 1. The thermal module 310 of the illustrated example is positioned adjacent the circuit board 308. Specifically, the thermal module 310 of the illustrated example is positioned over (e.g., above) the circuit board 308. In some example, at least a portion of the thermal module 310 is positioned directly adjacent (e.g., directly above) the processor 110 of the electronic components 108.

The chassis 300 of the illustrated example provides a relatively small form factor. By way of example, the chassis 300 (e.g., the cavity 306) of the illustrated example has a volume of between approximately 0.8 and 1.1 liters. In some examples, the chassis 300 defines a volume of approximately 1 liter. As used herein, approximately or substantially means within a zero to ten percent tolerance. Thus, the electronic components 108 and the thermal module 310 are positioned in the cavity 306 of the base 302 and the cover 304 couples to the base 302 to enclose the electronic components 108 within the chassis 300. The cooling system 102 and/or the thermal module 310 of the illustrated example support a 95 W TDP processor positioned in the chassis 300 defining a volume of approximately 1 liter. As used herein, thermal design power (TDP), sometimes referred to as thermal design point, means a maximum amount of heat generated by the processor 110 that the cooling system 102 (via the thermal module 310) can dissipate under any workload. For example, the cooling system 102 and/or the thermal module 310 can maintain a temperature of the processor 110 below a performance temperature (e.g., a Tcritical temperature) of the processor 110. As shown in FIG. 3B, the thermal module 310 extends across substantially an entire surface area of the circuit board 308 and/or electronic components 108.

Figure 4:
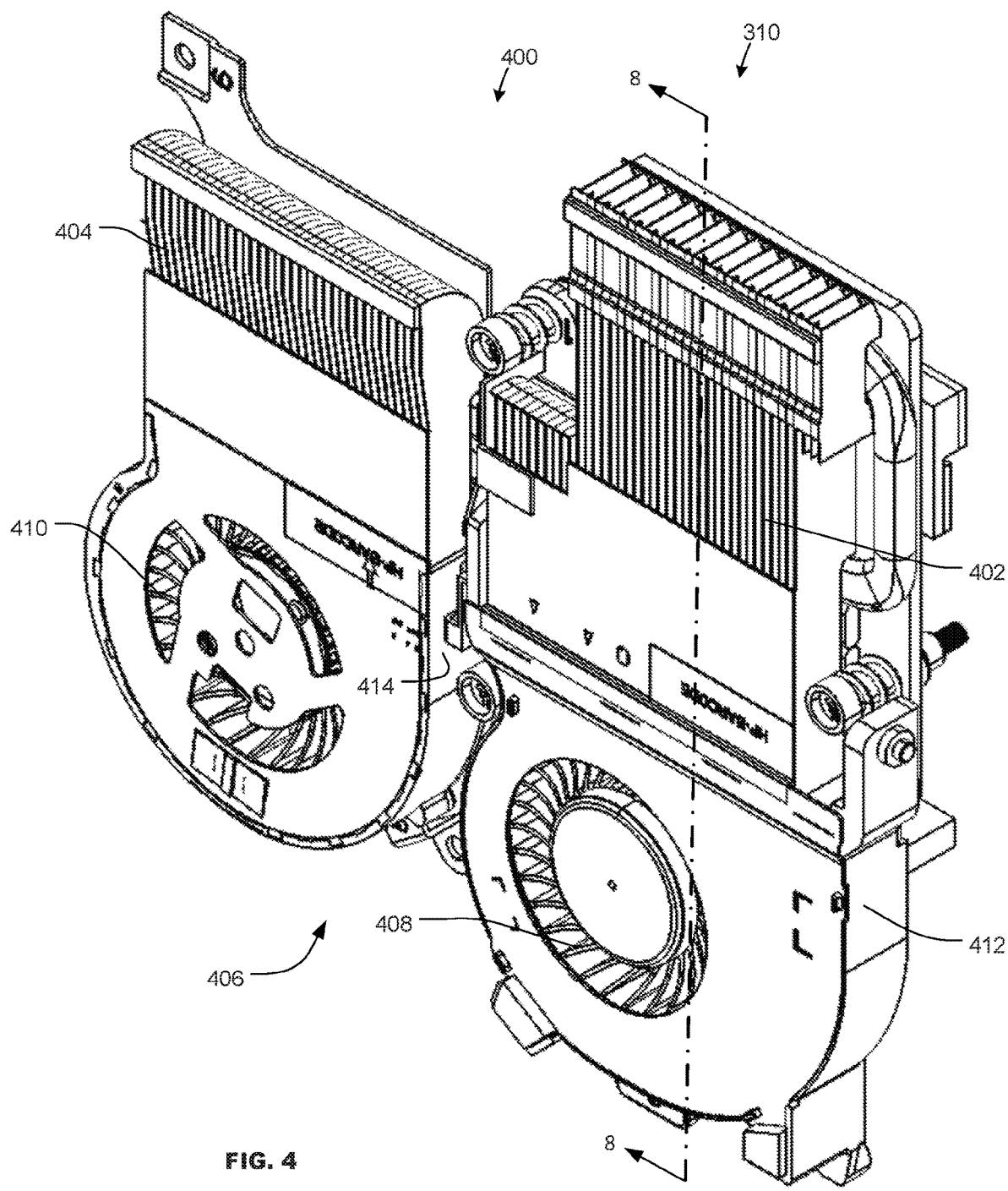
FIG. 4 is a perspective view of an example thermal module of the example electronic device of FIGS. 2A-2B and 3A-3B.

FIG. 4 is a perspective view of the example thermal module 310 of FIGS. 3A and 3B. The thermal module 310 of the illustrated example is a heatsink assembly 400. The heatsink assembly 400 of the illustrated example includes a first heatsink 402 and a second heatsink 404 positioned adjacent the first heatsink 402. The thermal module 310 of the illustrated example includes a fan assembly 406 coupled to the heatsink assembly 400. The fan assembly 406 is an example implementation of the airflow generator 118 of FIG. 1. The fan assembly 406 of the illustrated example includes a first fan 408 to generate a first airflow across the first heatsink 402 and a second fan 410 to generate a second airflow across the second heatsink 404. Specifically, the thermal module 310 of the illustrated example includes a first duct 412 to channel the first airflow from the first fan 408 to the first heatsink 402 and a second duct 414 to channel the second airflow from the second fan 410 to the second heatsink 404. In particular, the first duct 412 is fluidly isolated from the second duct 414. In this manner, a significant portion of airflow generated by the first fan 408 is directed toward the first heatsink 402 and a significant portion of airflow generated by the second fan 410 is directed toward the second heatsink 404. The fan assembly 408 (e.g., the first fan 408, the first duct 412, the second fan 410 and/or the second duct 414) can be composed of plastic, aluminum, sheet metal and/or any other suitable material(s).

Figure 5:
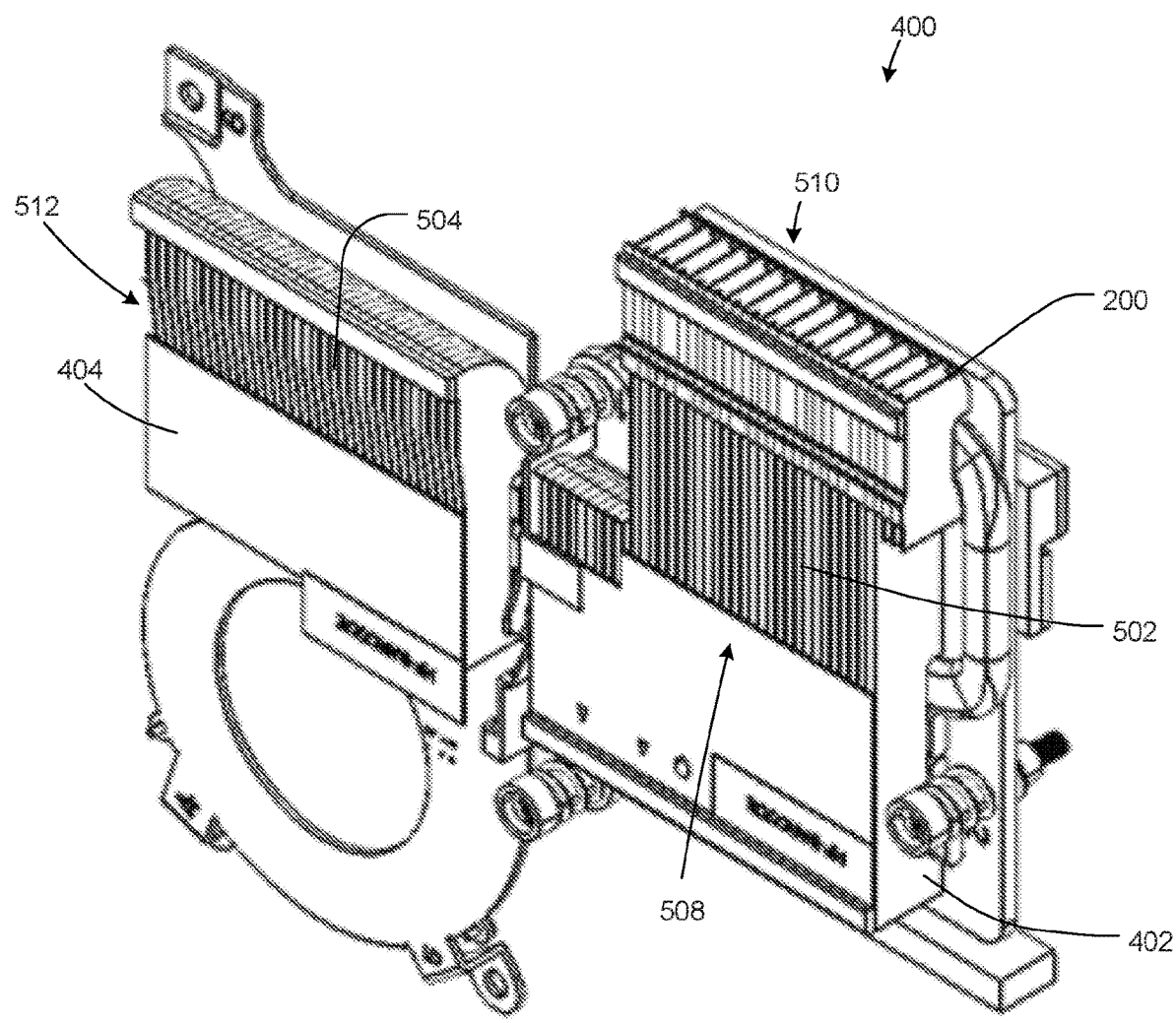
FIG. 5 is a perspective view of an example heatsink assembly of the example thermal module of FIG. 4.

FIG. 5 is a perspective view of the example heatsink assembly 400 of FIG. 4. For example, the heatsink assembly 400 of FIG. 5 is shown without the fan assembly 406 of FIG. 4. For example, the first fan 408, the second fan 410, the first duct 412 and the second duct 414 are not shown in FIG. 5. The heatsink assembly 400 of the illustrated example is a dual heatsink module that includes the first heatsink 402 and the second heatsink 404. The first heatsink 402 of the illustrated example includes a first plurality of fins 502, and the second heatsink 404 of the illustrated example includes a second plurality of fins 504. The first fins 502 define a first outlet 508 and a second outlet 510, and the second fins 504 defines a third outlet 512. Specifically, when the heatsink assembly 400 is positioned in the cavity 306 of the chassis 300, the first outlet 508 and the third outlet 512 are positioned or aligned with the first air outlet 216 defined by the cover 304, and the second outlet 508 is aligned with the second air outlet 218 defined by the rear panel 210.

The heatsink assembly 400 of the illustrated example enables removal or detachment of the fan assembly 406 (e.g., the first fan 408, the second fan 410, the first duct 412 and the second duct 414) from the heatsink assembly 400 to enable access to the electronic components 108 and/or the circuit board 308 positioned underneath the fan assembly (e.g., the first fan 408 and/or the second fan 410) without having to remove the heatsink assembly 400 from the chassis 300. In some examples, the heatsink assembly 400 of the illustrated example is a stand-alone structure that can be sold separately from the fan assembly 406.

Figure 6A:
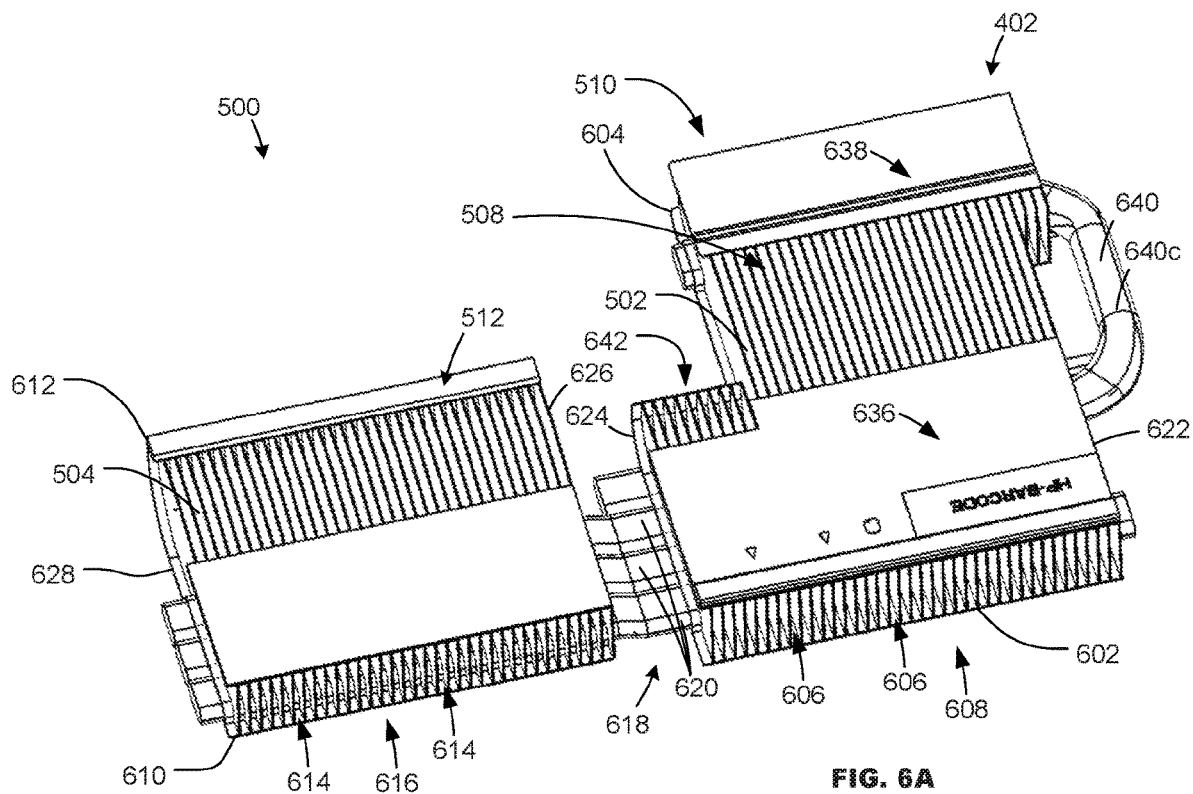
FIG. 6A is a perspective view of the example heatsink assembly of FIG. 5.
Figure 6B:
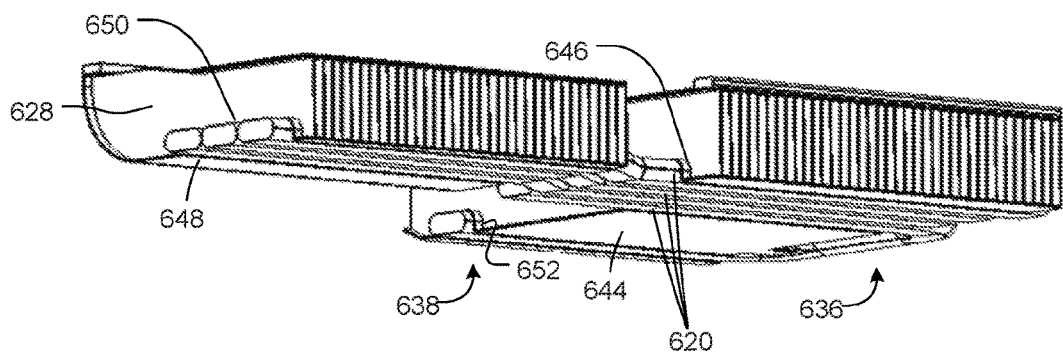
FIG. 6B is another perspective view of the example heatsink assembly of FIG. 5.
Figure 6C:
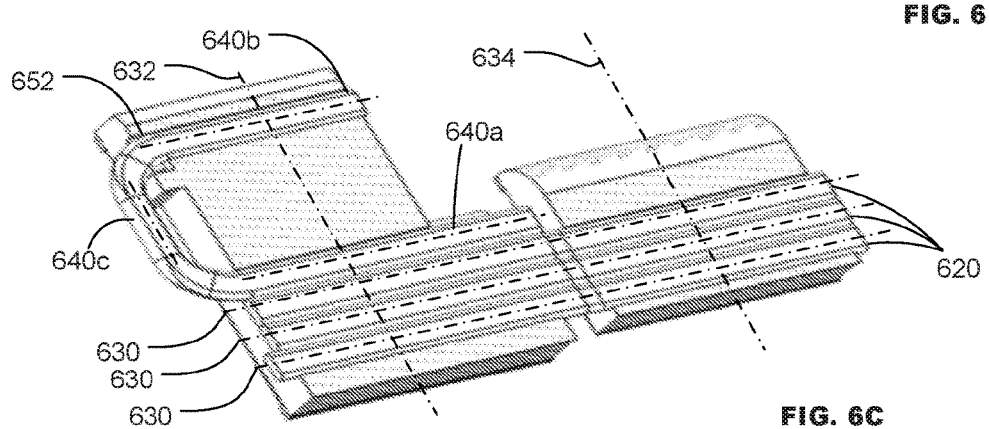
FIG. 6C is a bottom, perspective view of the example heatsink assembly of FIG. 5.

FIGS. 6A-6C illustrate different perspective views of the example heatsink assembly 500 of FIG. 5. The first fins 502 of the first heatsink 402 of the illustrated example extend between a first end 602 of the first heatsink 402 and a second end 604 of the first heatsink 402 opposite the first end 602. The first fins 502 are spaced relative to each other to define airflow passageways or airflow channels 606 between a first inlet 608 adjacent the first end 602 of the first heatsink 402 and the respective first and second outlets 508 and 510. The second outlet 510 of the illustrated example is positioned adjacent the second end 604 of the first heatsink 402.

The second fins 504 of the illustrated example extend between a first end 610 of the second heatsink 404 and a second end 612 of the second heatsink 404 opposite the first end 610. The second fins 504 are spaced relative to each other to define airflow passageways or airflow channels 614 between a second inlet 616 adjacent the first end 610 of the second heatsink 404 and the third outlet 512.

The first heatsink 402 of the illustrated example is spaced apart from the second heatsink 404 to form a gap 618 between the first and second heatsinks 402, 404. To transfer heat between the first heatsink 402 and the second heatsink 404 across the gap 618, the first heatsink 402 of the illustrated example is thermally coupled the second heatsink 404 via heat pipes 620. The heat pipes 620 of the illustrated example extends between a first side 622 of the first heatsink 402 and a second side 624 of the first heatsink 402, across the gap 618, and between a first side 626 of the second heatsink 404 and a second side 628 of the second heatsink 404. By way of example, each of the heat pipes 620 includes a longitudinal axis 630 that is non-parallel (e.g., perpendicular) relative to a longitudinal axis 632 (e.g., extending between the first end 602 and the second end 604) of the first heatsink 402 and a longitudinal axis 634 (e.g., extending between the first end 610 and the second end 612) of the second heatsink 404. In the illustrated example, the heat pipes 620 includes three heat pipes. However, in some examples, the thermal module 310 may include a single heat pipe, two heat pipes 620, or more than three heat pipes 620. Each of the heat pipes 620 can have the same length and/or a different length relative to another heat pipe 620.

Additionally, to transfer heat between a first portion 636 (e.g., a central area) of the first fins 502 and a second portion 638 (e.g., the second outlet 510) of the first fins 502 spaced from the first portion 636, the first heatsink 402 of the illustrated example includes a heat pipe 640. In particular, the heat pipe 640 extends between the first portion 636 and the second end 604 of the first heatsink 402 adjacent the second outlet 510. The heat pipe 640 of the illustrated example transfers heat from the heat pipes 620 and/or the first portion 636 of the first heatsink 402 to the second end 604 of the first heatsink 402 adjacent the second outlet 510. To this end, the heat pipes 620, 640 of the illustrated example facilitate or improve heat dissipation from the first portion 636 of the first heatsink 402 that is to be positioned adjacent (e.g., immediately adjacent or directly above) the processor 110 (e.g., a CPU). Such location can typically receive the greatest amount of heat generated by the electronic components 108 (e.g., the processor 110) within the chassis 300. The heat pipes 620, 640 facilitate or increase heat dissipation by transferring heat generated adjacent the first portion 636 to remote locations relative to the first portion 636, thereby increasing efficiency of the cooling system 102. The first heatsink 402 of the illustrated example employs a third plurality of fins 642 that extend across a thickness defined by the heat pipes 620, 640. The third fins 642 have a longitudinal length that is less than a longitudinal length of the first fins 502 and the second fins 504. In addition, the second fins 504 have a longitudinal length that is less than the first fins 502.

To receive the heat pipes 620 and/or 640, a lower (e.g., a bottom) surface 644 of the first fins 502 of the first heatsink 402 define a first recess 646 (e.g., a notch) and a lower (e.g., a bottom) surface 648 of the second fins 504 of the second heatsink 404 define a second recess 650 (e.g., a notch). In this manner, the first recess 646 and the second recess 650 receive the heat pipes 620. Additionally, the first heatsink 402 includes a third recess 652 (e.g., a notch) adjacent the second end 604 of the first heatsink 402. In this manner, the first recess 646 and the third recess 652 receive the heat pipe 640. Specifically, a first portion 640a of the heat pipe 640 is received by the first recess 646, and a second portion 640b of the heat pipe 640 is received by the third recess 652. A third portion 640c of the heat pipe 640 connects the first and second portions 640a, 640b and extends or projects outside (e.g., from the first side 622) of the first heatsink 402. The first portion 640a of the illustrated example is substantially parallel relative to the second portion 640b, and the third portion 640c is substantially perpendicular relative to the first and second portions 640a, 640b.

When positioned in the respective recesses 646, 650 and 652, the heat pipes 620, 640 are substantially flush or aligned relative to the lower surface 644 of the first fins 502 and the lower surface 648 of the second fins 504. In some examples, the lower surfaces of the heat pipes 620, 640 are offset relative to the lower surfaces 644, 648 of the first and second heatsinks 402, 404, respectively (i.e., the lower surfaces of the heat pipes 620, 640 are not flush relative to the lower surfaces 644, 648).

The heatsink assembly 500 (e.g., the first and second heatsinks 402, 404) and/or the first and second heat pipes 620,640 are composed of a material having relative high thermal conductively. For example, the heatsink assembly 500 of the illustrated example can be composed of copper, aluminum and/or any other suitable material(s).

FIG. 7A is an enlarged view of the second outlet 510 defined by the first fins 502 of the first heatsink 402. FIG. 7B is a side view of the thermal module 310 of FIG. 4. In some instances, a heat dissipation surface area provided by the first fins 502 may cause an increase in friction between the air and the first fins 502 as the air flows through the airflow channels 606 and along the first fins 502 toward the second outlet 510. As a result, a thermal impedance may form adjacent the second outlet, which can reduce the airflow through the second outlet 510 and cause a reduction in heat dissipation efficiency of the thermal module 310. To prevent thermal impedance that may otherwise restrict airflow through the second outlet 510 and to reduce the efficiency of the thermal module 310, each of the first fins 502 of the first heatsink 402 of the illustrated example includes a reduced height portion 702 adjacent (e.g., defining) the second outlet 510. The first fins 502 defining the reduced height portion 702 have a first height 704 that is smaller than a height 706 of a second portion 708 of the first fins 502 that do not define the reduced height portion 702. For example, the second portion 708 of the illustrated example is between the first end 602 of the first heatsink 402 and the reduced height portion 702. For example, the height 706 of the first fins at the first inlet 608 is greater than the height 706 of the first fins 502 at the second outlet 510. The reduced height portion 702 of the illustrated example increases airflow (e.g., a mass flowrate) through the second outlet 510 (e.g., prevents or reduces thermal impedance during operation. In some examples, the reduced height portion 702 of the illustrated example reduces acoustic noise below a threshold limitation.

FIG. 8 is a cross-sectional view of the example thermal module 310 taken along line 8-8 of FIG. 4. The fan assembly 406 of the illustrated example is coupled (e.g., removably attached) to the heatsink assembly 500. The first fan 408 generates a first airflow across the first heatsink 402 between the first inlet 608 and toward at least one of the first outlet 508 and the second outlet 510. The first duct 412 channels the airflow from the first fan 408 to the first heatsink 402 (e.g., the first inlet 608 of the heatsink 402).

The first duct 412 of the illustrated example is defined by a first plate 802 (e.g., an upper plate), a second plate 804 (e.g., a lower plate), and a peripheral plate 806. The first fan 408 is enclosed between the first plate 802, the second plate 804 and the peripheral plate 806. An end 808 of the first duct 412 of the illustrated example defines an opening to receive the first fins 502 of the first heatsink 402 such that the first duct 412 encloses the first inlet 608 (e.g., the first end 602 (FIG. 6)) of the first heatsink 402. Specifically, the first plate 802 overlaps a portion of respective upper surfaces of the first fins 502 and the second plate 804 overlaps a portion of respective lower surfaces of the first fins 502 adjacent the first end 602 of the first heatsink 402. The peripheral plate 806 overlaps a portion of a side surface of a first outermost one of the first fins 502 adjacent the first side 622 (FIG. 6) of the first heatsink 402 and a portion of a side surface of a second outermost one of the first fins 502 adjacent the second side 624 (FIG. 6) of the first heatsink 402. Gaps 810, 812 are formed between the first plate 802 and the second plate 804 and the first fan 408 to allow airflow generated by the first fan 408 to flow towards the first inlet 608. The airflow generated by the first fan 408 flows through the gaps 810, 812, to the first inlet 608, and to the first and second outlets 508, 510. As the airflow moves or flows within the airflow channels 606 toward the first and second outlets 508, 510, the airflow passes across the first fins 502 and across the heat pipes 620, 640 to dissipate heat generated by the electronic components 108. The first heatsink 402 includes a plate 814 positioned over a portion an upper surface of the first fins 502 (e.g., and extending across the heat pipes 620, and the second portion 640b of heat pipe 640) to reduce heat dissipation upstream from the first outlet 508 and the second outlet 510. In this manner, the heated airflow is directed toward the first and second outlets 508, 510. The heat air exits the first heatsink 402 via the first outlet 508 and toward the first air outlet 216 (FIG. 2A) of the chassis 300 and via the second outlet 510 toward the second air outlet 218 defined by the rear panel 210.

FIG. 9 is a cross-sectional view of the thermal module 310 taken along line 9-9 of FIG. 8. The second duct 414 of the illustrated example is constructed similar to the first duct 412. For example, the second duct 414 is defined by a first plate 902 (e.g., an upper plate), a second plate 904 (e.g., a lower plate), and a peripheral plate 906. The second fan 410 is enclosed between the first plate 902, the second plate 904 and the peripheral plate 906. An end 908 of the second duct 414 of the illustrated example defines an opening to receive the second fins 504 of the second heatsink 404 such that the second duct 414 encloses the second inlet 616 (e.g., the first end 610) of the second heatsink 404. The airflow generated by the second fan 410 flows through gaps 910, 912 formed between the second fan 410 and the upper and lower plates 902, 904 and towards the second inlet 616 of the second heatsink 404. As the airflow moves flows within the airflow channels 614 between the second inlet 616 and the third outlet 512, the airflow passes across the second fins 504 and the heat pipes 620 to dissipate heat generated by the electronic components 108 and transferred from the first heatsink 402. The second heatsink 404 includes a plate 914 positioned over a portion of the second fins 504 extending over the heat pipes 620 to reduce heat dissipation upstream from the third outlet 512. In this manner, the heated airflow is directed toward the third outlet 512. The heated air exits the second heatsink 404 via the third outlet 512 and exits the chassis 300 via the first air outlet 216.

Figure 10:
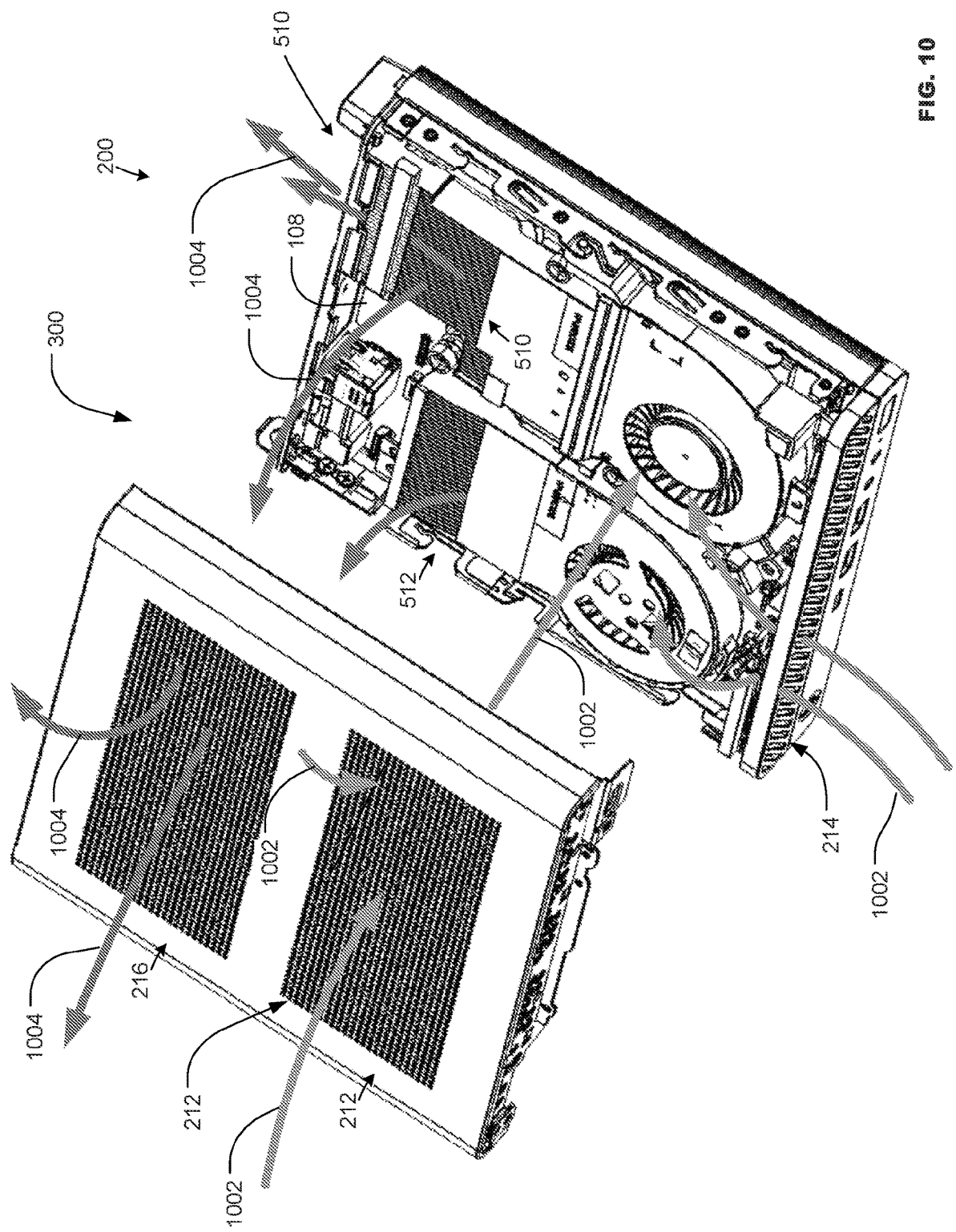
FIG. 10 is a partial, exploded view of the example electronic device of FIGS. 2A and 2B.

FIG. 10 is a partially exploded, perspective view of the electronic device 200 of FIGS. 2A and 2B. In operation, the electronic components 108 (e.g., the processor 110) generate heat (e.g., a great amount of heat). Due to the relatively small form factor of the chassis 300 (e.g., having a volume less than 1 liter), the temperature within the cavity 306 increases relatively rapidly. To remove or dissipate the heat from the electronic components 108, the thermal management system 114 (FIG. 1) operates the first and second fans 408 and 410. The thermal management system 114 of the illustrated example varies (e.g., increases or decreases) a speed of the first and second fans 408, 410 to vary (e.g., increase or decrease) an amount airflow through the chassis 300. The first and second fans 408, 410 draw airflow 1002 into the chassis 300 via the first air inlet 212 and the second air inlet 214. The first fan 408 directs the airflow 1002 through the airflow channels 606 of the first heatsink 402 between the first inlet 608 and the first and second outlets 508, 510. The airflow 1002 dissipates heat from the first fins 502 and the heat pipes 620, 640 as the airflow 1002 flows toward the first and second outlets 508, 510. Additionally, the heat pipes 620 transfer heat from the first heatsink 402 to the second heatsink 404 and the heat pipe 640 transfers heat from the first portion 636 of the first heatsink 402 to the second portion 638 adjacent the second outlet 510. Likewise, the second fan 408 directs the airflow 1002 through the airflow channels 614 of the second heatsink 404 between the second inlet 616 and the third outlet 512. The airflow 1002 dissipates heat from the second fins 504 and the heat pipes 620 as the airflow 1002 flows toward the third outlet 512. Heat air 1004 from the first and third outlets 508 and 512 exits the chassis 300 via the first air outlet 216 and the second outlet 510 via the second air outlet 218 of the rear panel 210.

As disclosed above, the electronic device 200 of the illustrated example is under 1 liter in volume and is capable of supporting a 95 W TDP processor. For example, an electronic device including a chassis having a volume that is approximately 1-liter and supporting a 95 W TDP processor can maintain a temperature of a CPU (e.g., the processor 110) between approximately 40 degrees Celsius and 95 degrees Celsius with the airflow 1002 having temperatures of between 25 degrees Celsius and 35 degrees Celsius. Additionally, the electronic device 200 of the illustrated example is capable of maintaining acoustic levels below (e.g., less than) desired thresholds. For example, the electronic device 200 employing a 95 W TDP processor housed in a chassis (e.g., the chassis 302) defining approximately 1 liter of volume can perform with a sound power level (SWL) of approximately 2.9 Bels unit and a sound pressure level (SPL) of approximately 18.9 decibels (dBA) when the processor (e.g., the processor 110) is idle or a hard disk drive is performing a random seek, and an SWL of approximately 2.9 Bels unit and an SPL of 34.9 dBA when the processor performs a utilization test at 25 degrees Celsius. In some instances, the electronic device 200 of the illustrated example can generate a total thermal output of approximately 135 W (e.g., 95 W from the processor 110 and approximately 30 W from the other electrical components 108), while maintaining acoustic levels (e.g., the SWL and SPL) below certain thresholds (e.g., an SPL threshold of 20 dBA at idle or HDD random seek, an SPL threshold of 35 dBA, etc.) and temperatures (e.g., of the processor 110, the electronic components 108, inside the cavity 306, etc.) to temperatures below threshold temperatures (e.g., between 30 degrees Celsius and 95 degrees Celsius when an ambient temperature is between approximately 25 degrees Celsius and 35 degrees Celsius).

Figure 11:
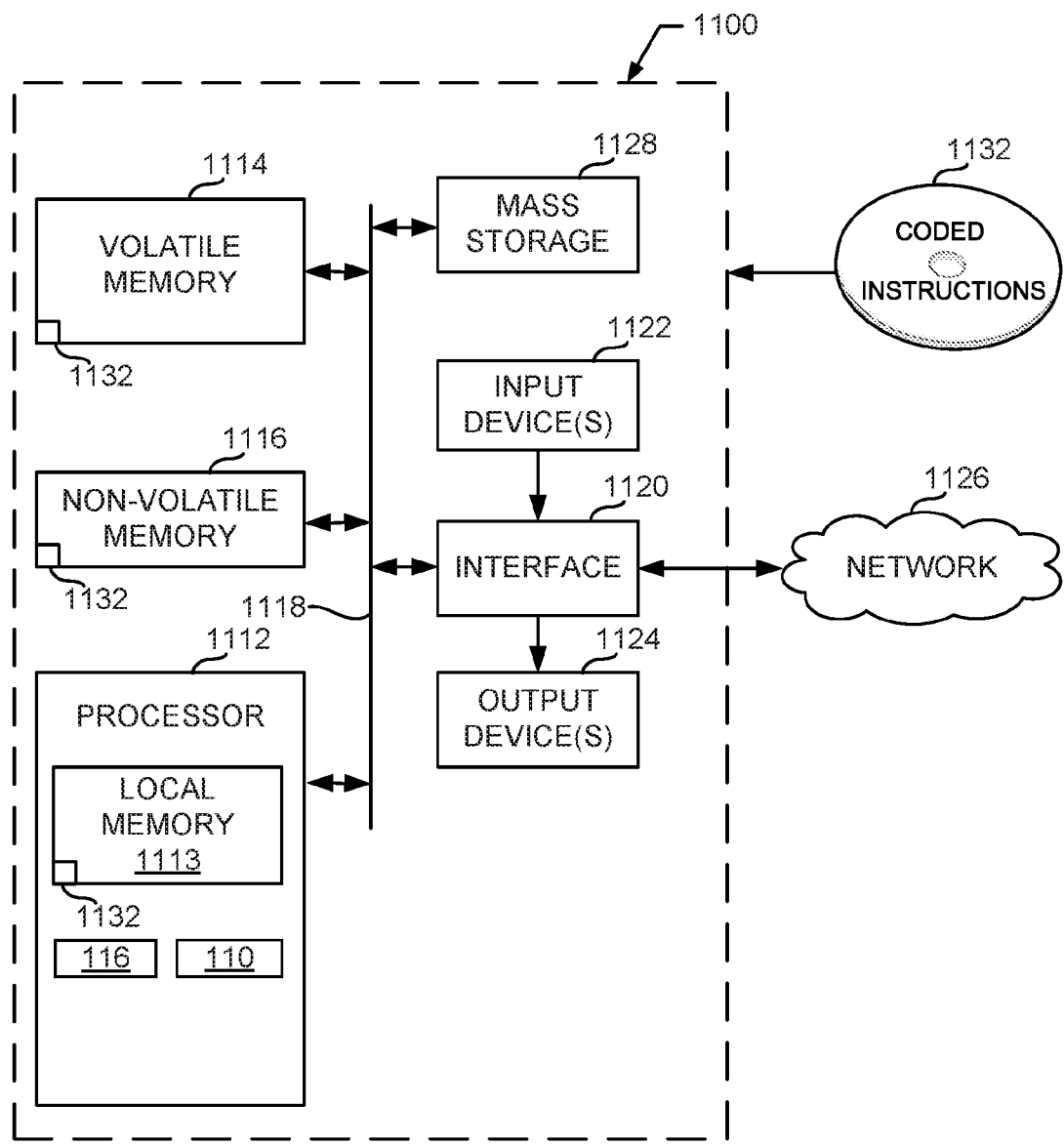
FIG. 11 is a block diagram of an example processing platform structured to execute instructions to implement an example cooling system of FIG. 1.

FIG. 11 is a block diagram of an example processor platform 1100 structured to implement the thermal management system 116, the first fan 408, the second fan 410 and/or, more generally, the cooling system 102 of FIG. 1. The processor platform 1100 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a headset or other wearable device, or any other type of computing device.

The processor platform 1100 of the illustrated example includes a processor 1112. The processor 1112 of the illustrated example is hardware. For example, the processor 1112 can be implemented by integrated circuit(s), logic circuit(s), microprocessor(s), GPU(s), DSP(s), or controller(s) from any desired family or manufacturer. The hardware processor may be a semiconductor based (e.g., silicon based) device. In this example, the processor implements aspects of the example thermal management system 114, the first fan 408, the second fan 410 and/or, more generally, the cooling system 102 of FIG. 1.

The processor 1112 of the illustrated example includes a local memory 1113 (e.g., a cache). The processor 1112 of the illustrated example is in communication with a main memory including a volatile memory 1114 and a non-volatile memory 1116 via a bus 1118. The volatile memory 1414 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 1116 may be implemented by flash memory and/or any other desired type of memory device. Access to the main memory 1114, 1116 is controlled by a memory controller.

The processor platform 1100 of the illustrated example also includes an interface circuit 1120. The interface circuit 1120 may be implemented by any type of interface standard, such as an Ethernet interface, a universal serial bus (USB), a Bluetooth® interface, a near field communication (NFC) interface, and/or a PCI express interface.

In the illustrated example, input devices 1122 are connected to the interface circuit 1120. The input device(s) 1122 permit(s) a user to enter data and/or commands into the processor 1112. The input device(s) can be implemented by, for example, an audio sensor, a microphone, a camera (still or video), a keyboard, a button, a mouse, a touchscreen, a track-pad, a trackball, isopoint and/or a voice recognition system.

Output devices 1124 are also connected to the interface circuit 1420 of the illustrated example. The output devices 1124 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 1120 of the illustrated example, thus, typically includes a graphics driver card, a graphics driver chip and/or a graphics driver processor.

The interface circuit 1120 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1126. The communication can be via, for example, an Ethernet connection, a digital subscriber line (DSL) connection, a telephone line connection, a coaxial cable system, a satellite system, a line-of-site wireless system, a cellular telephone system, etc.

The processor platform 1100 of the illustrated example also includes mass storage devices 1128 for storing software and/or data. Examples of such mass storage devices 1128 include floppy disk drives, hard drive disks, compact disk drives, Blu-ray disk drives, redundant array of independent disks (RAID) systems, and digital versatile disk (DVD) drives.

The machine executable instructions for the thermal management system 116 may be stored in the mass storage device 1128, in the volatile memory 1114, in the non-volatile memory 1116, and/or on a removable non-transitory computer readable storage medium such as a CD or DVD.

At least some of the aforementioned examples include at least one feature and/or benefit including, but not limited to, the following:

In some examples, a thermal module for use with an electronic device includes a first heatsink defining a first airflow exit. The first heatsink including a first set of fins having a first height and a second set of fins having a second height. The second height being less than the first height. The second set of fins adjacent the first airflow exit. A second heatsink defines a second airflow exit. The second heatsink is spaced from the first heatsink to form a gap therebetween. The second heatsink is thermally coupled to the first heatsink via a heat pipe.

In some examples, a first fan and a second fan to cool respective ones of the first and second heatsinks. The first fan is to provide a first airflow to the first heatsink via a first duct and the second fan is to provide a second airflow to the second heatsink via a second duct.

In some examples, the further including the electronic device, wherein the electronic device includes a chassis having a volume that is less than or equal to 1 Liter and includes a full performance 95 Watt Thermal Design Power processor.

In some examples, wherein the cooling system is to maintain a temperature of the processor between approximately 45 degrees Celsius and 95 degrees Celsius when the processor operates at maximum power and the ambient temperature is approximately between 25 degrees Celsius and 35 degrees Celsius.

In some examples, a thermal module for an electronic device a first heatsink, and a second heatsink adjacent the first heat sink. A first heat pipe thermally couples the first heatsink and the second heatsink. The first heat pipe is to transfer heat between the first and second heatsinks. A first fan is to generate a first airflow across the first heatsink. The first airflow is to flow through a first outlet and a second outlet. The first outlet is non-parallel relative to the second outlet. A second fan is to generate a second airflow across the second heatsink. The second airflow is to flow through a third outlet. The third outlet is non-perpendicular relative to the second outlet.

In some examples, a first set of heat fins of the first heatsink adjacent the first outlet has a first height that is smaller compared to a height of a second set of fins adjacent the first set of fins.

In some examples, the second set of fins are positioned between the first fan and the first set of fins.

In some examples, a first duct to channel the first airflow from the first fan to the first heatsink.

In some examples, a second duct to channel the second airflow from the second fan to the second heatsink.

In some examples, the first duct is isolated from the second duct.

In some examples, a second heat pipe extending between a central area of the first heatsink and the first outlet.

In some examples, a first portion of the second heat pipe is positioned within the first heatsink and a second portion of the second heat pipe extends outside of the first heatsink.

In some examples, an electronic device includes a chassis defining a cavity. A circuit board is positioned in the cavity. A first heatsink is positioned adjacent the circuit board. The first heatsink includes first fins extending between a first end of the first heatsink and a second end of the first heatsink opposite the first end. A portion of the first fins has a reduced height adjacent the second end to increase airflow characteristics and reduce noise conditions at the second end of the first heatsink. A first fan is to provide a first airflow across the first heatsink. A first duct is positioned between the first fan and the first heatsink to channel the first airflow toward the first heatsink.

In some examples, a second heatsink is positioned adjacent the first heatsink and the circuit board. The second heatsink includes second fins extending between a third end of the second heatsink and a fourth end of the second heatsink opposite the third end. A second fan is to provide a second airflow across the second heatsink. A second duct is positioned between the second fan and the second heatsink to channel the second airflow toward the second heatsink. A plurality of pipes extends between the first heatsink and the second heatsink to thermally couple the first and second heatsinks.

In some examples, the cavity defines a volume of between approximately 0.9 Liters and 1 Liter, and wherein the circuit board includes a 95-Watt processor. The first heatsink and the second heatsink to maintain a temperature in the cavity less than 60 degrees Celsius.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed:

1. A thermal module for use with an electronic device comprising:
   a first heatsink defining a first airflow, the first airflow having a first airflow exit and a second airflow exit, the first airflow exit non-parallel relative to the second airflow exit, the first heatsink including a first set of fins having a first height and a second set of fins having a second height, the second height less than the first height, the second set of fins adjacent the second airflow exit; and
   a second heatsink defining a second airflow, the second airflow having a third airflow exit, the second heatsink spaced from the first heatsink to form a gap therebetween, the second heatsink thermally coupled to the first heatsink via a heat pipe.

2. The thermal module of claim 1, further including a first fan and a second fan to cool respective ones of the first and second heatsinks, the first fan to provide the first airflow to the first heatsink via a first duct and the second fan to provide the second airflow to the second heatsink via a second duct.

3. The thermal module of claim 1, further including the electronic device, wherein the electronic device includes a chassis having a volume that is less than or equal to 1 Liter and includes a full performance 95 Watt Thermal Design Power processor.

4. The thermal module of claim 3, wherein the thermal module is to maintain a temperature of the processor between approximately 45 degrees Celsius and 95 degrees Celsius when the processor operates at maximum power and an ambient temperature is approximately between 25 degrees Celsius and 35 degrees Celsius.

5. A thermal module for an electronic device comprising:
   a first heatsink;
   a second heatsink adjacent the first heat sink;
   a first heat pipe thermally coupling the first heatsink and the second heatsink, the first heat pipe to transfer heat between the first and second heatsinks;
   a first fan to generate a first airflow across the first heatsink, the first airflow to flow through a first outlet and a second outlet, the first outlet being non-parallel relative to the second outlet; and
   a second fan to generate a second airflow across the second heatsink, the second airflow to flow through a third outlet, the third outlet being non-perpendicular relative to the second outlet.

6. The thermal module of claim 5, wherein a first set of heat fins of the first heatsink adjacent the first outlet has a first height that is smaller compared to a height of a second set of fins adjacent the first set of fins.

7. The thermal module of claim 6, wherein the second set of fins are positioned between the first fan and the first set of fins.

8. The thermal module of claim 5, further including a first duct to channel the first airflow from the first fan to the first heatsink.

9. The thermal module of claim 8, further including a second duct to channel the second airflow from the second fan to the second heatsink.

10. The thermal module of claim 9, wherein the first duct is isolated from the second duct.

11. The thermal module of claim 5, further including a second heat pipe extending between a central area of the first heatsink and the first outlet.

12. The thermal module of claim 11, wherein a first portion of the second heat pipe is positioned within the first heatsink and a second portion of the second heat pipe extends outside of the first heatsink.

13. An electronic device comprising:
   a chassis defining a cavity;
   a circuit board in the cavity;
   a first heatsink adjacent the circuit board, the first heatsink including first fins extending between a first end of the first heatsink defining a first inlet and a second end of the first heatsink opposite the first end defining a first outlet, a first portion of the first fins having a reduced height adjacent the second end, a second portion of the first fins defining a second outlet, the second outlet being non-parallel relative to the first outlet;
   a first fan to provide a first airflow across the first heatsink, the first airflow to flow through the first outlet and the second outlet; and
   a first duct between the first fan and the first heatsink to channel the first airflow toward the first heatsink.

14. The electronic device of claim 13, further including:
a second heatsink adjacent the first heatsink and the circuit board, the second heatsink including second fins extending between a third end of the second heatsink defining a second inlet and a fourth end of the second heatsink opposite the third end defining a third outlet;
a second fan to provide a second airflow across the second heatsink, the second airflow to flow through the third outlet;
a second duct between the second fan and the second heatsink to channel the second airflow toward the second heatsink; and
a plurality of pipes extending between the first heatsink and the second heatsink to thermally couple the first and second heatsinks.

15. The electronic device of claim 13, wherein the cavity defines a volume of between approximately 0.9 Liters and 1 Liter, and wherein the circuit board includes a 95-Watt processor, the first heatsink and the second heatsink to maintain a temperature in the cavity less than 60 degrees Celsius.

16. The electronic device of claim 13, wherein the cavity defines a volume of between approximately 0.9 Liters and 1 Liter, and wherein the circuit board includes processor circuitry, the first heatsink and the second heatsink to maintain a temperature in the cavity less than 60 degrees Celsius.

\* \* \* \* \*